United States Patent
Han et al.

(10) Patent No.: US 6,788,574 B1
(45) Date of Patent: Sep. 7, 2004

(54) ELECTRICALLY-ALTERABLE NON-VOLATILE MEMORY CELL

(75) Inventors: Kim-Kwong Michael Han, Los Gatos, CA (US); Narbeh Derhacobian, Belmont, CA (US); Jaroslav Raszka, Fremont, CA (US)

(73) Assignee: Virage Logic Corporation, Fremont, CA (US)

( * ) Notice: Subject to any disclaimer, the term of this patent is extended or adjusted under 35 U.S.C. 154(b) by 0 days.

(21) Appl. No.: 10/295,742

(22) Filed: Nov. 15, 2002

Related U.S. Application Data (60) Provisional application No. 60/340,149, filed on Dec. 6, 2001.

(51) Int. Cl.[7] ............................................. G11C 14/00
(52) U.S. Cl. ................................. 365/185.08; 365/149
(58) Field of Search ...................... 365/185.08, 185.01, 365/185.28, 218, 149

(56) References Cited

U.S. PATENT DOCUMENTS

| | | | |
|---|---|---|---|
| 4,375,086 A | | 2/1983 | Van Velthoven |
| 4,467,457 A | | 8/1984 | Iwahashi et al. |
| 4,672,580 A | * | 6/1987 | Yau et al. ............... 365/185.08 |
| 4,884,241 A | | 11/1989 | Tanaka et al. |
| 4,951,257 A | | 8/1990 | Imamiya et al. |
| 4,970,691 A | | 11/1990 | Atsumi et al. |
| 5,251,171 A | | 10/1993 | Yamauchi |
| 5,299,162 A | | 3/1994 | Kim et al. |
| 5,331,597 A | | 7/1994 | Tanaka |
| 5,430,670 A | | 7/1995 | Rosenthal |
| 5,587,945 A | * | 12/1996 | Lin et al. ................. 365/185.1 |
| 5,668,752 A | | 9/1997 | Hashimoto |
| 5,732,022 A | | 3/1998 | Kato et al. |
| 5,742,542 A | * | 4/1998 | Lin et al. ............... 365/185.08 |
| 5,761,121 A | | 6/1998 | Chang |
| 5,768,186 A | | 6/1998 | Ma |
| 5,781,489 A | | 7/1998 | Okamoto |
| 5,801,076 A | | 9/1998 | Ghneim et al. |
| 5,805,013 A | | 9/1998 | Ghneim et al. |
| 5,808,953 A | | 9/1998 | Kim et al. |
| 5,854,114 A | | 12/1998 | Li et al. |
| 5,885,870 A | | 3/1999 | Maiti et al. |
| 5,942,780 A | * | 8/1999 | Barsan et al. ............ 365/185.1 |
| 6,018,477 A | | 1/2000 | Wang |
| 6,064,105 A | | 5/2000 | Li et al. |
| 6,069,382 A | | 5/2000 | Rahim |
| 6,094,394 A | | 7/2000 | La Rosa |
| 6,295,226 B1 | * | 9/2001 | Yang ..................... 365/185.01 |
| 6,324,097 B1 | | 11/2001 | Chen et al. |
| 6,330,186 B2 | | 12/2001 | Tanaka |
| 6,337,808 B1 | | 1/2002 | Forbes |
| 6,407,946 B2 | | 6/2002 | Maruyama et al. |
| 6,417,728 B1 | | 7/2002 | Baschirotto et al. |
| 6,445,614 B1 | | 9/2002 | Tsai et al. |

OTHER PUBLICATIONS

McPartland et al., "1.25 Volt, Low Cost, Embedded FLASH Memory for Low Density Applications", 2000 Symposium on VLSI Circuits Digest of Technical Papers, pp. 158–161.
Simon J. Lovett, "The Nonvolatile Cell Hidden in Standard CMOS Logic Technologies", IEEE Transactions on Electron Devices, vol. 48, No. 5, May 2001, pp. 1017–1018.
Ohsaki et al., "A Single Polysilicon wafer EEPROM Cell Structure for Use in Standard CMOS Processes", IEEE Journal of Solid–State Circuits, vol. 29*, No. 3, Mar. 1994, pp. 311–316.

* cited by examiner

*Primary Examiner*—Thong Le
(74) *Attorney, Agent, or Firm*—Blakely, Sokoloff, Taylor & Zafman LLP (57) ABSTRACT

A method, apparatus, and system in which an embedded memory comprises one or more electrically-alterable non-volatile memory cells that include a coupling capacitor, a read transistor, and a tunneling capacitor. The coupling capacitor has a first gate composed of both N+ doped material and P+ doped material, and a P+ doped region abutted to a N+ doped region. The P+ doped region abutted to the N+ doped region surrounds the first gate. The read transistor has a second gate. The tunneling capacitor has a third gate composed of both N+ doped material and P+ doped material.

22 Claims, 9 Drawing Sheets

Figure 2

Figure 3a  NMOS Read Transistor Implementation

Figure 3b

PMOS Read Transistor Implementation

ELECTRICALLY-ALTERABLE NON-VOLATILE MEMORY CELL

RELATED APPLICATIONS

This application is a non-provisional application that claims the benefit of the file date of U.S. Provisional Patent Application Serial No. 60/340,149, filed Dec. 6, 2001.

FIELD OF THE INVENTION

This invention generally relates to embedded memories. More particularly an aspect of this invention relates to an embedded memory having one or more electrically-alterable non-volatile memory cells.

BACKGROUND OF THE INVENTION

A non-volatile memory retains the contents of the information stored in a memory cell even when the power is turned off. Many System-on-Chip (SoC) design teams find themselves confronting a seeming conundrum: How to design non-volatile memory (NVM) into a SoC project. To achieve a single chip solution, the design team typically has little option but to select a special process technology that trails the most current standard logic process by two or three technology generations. This choice generally requires additional processing steps that increase wafer costs. Alternatively, the team could implement a less efficient, more costly, slower, and larger two-chip solution by separating the SoC and the NVM into discrete components.

Figure 1:
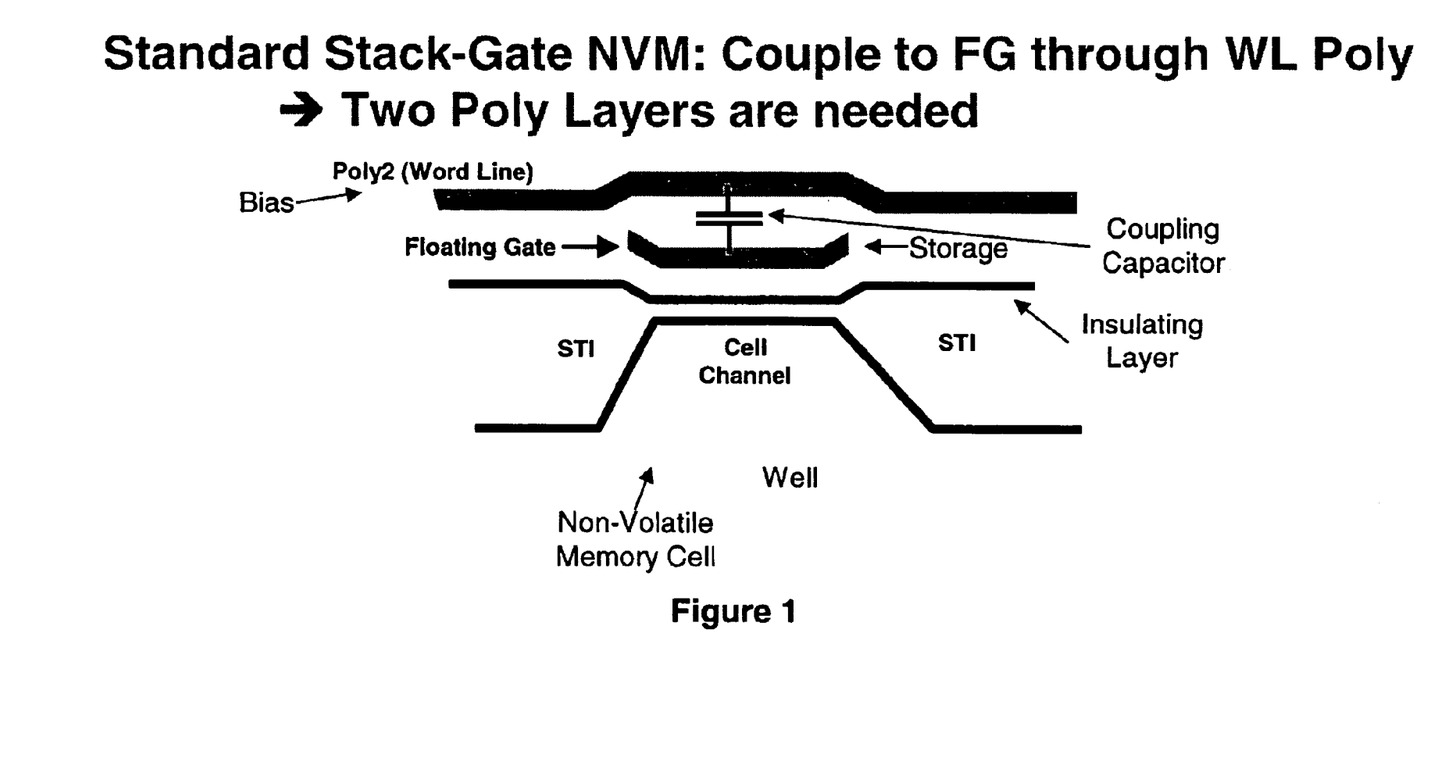
FIG. 1 illustrates a prior technique of creating an electrically-alterable nonvolatile memory cell.

FIG. 1 illustrates a prior technique of creating a non-volatile memory cell. The previous technique created a two polysilicon layers for the nonvolatile memory cell. The second polysilicon layer was the word line, and the word line receives a bias voltage. The bias voltage is coupled from the word line to the first polysilicon layer, referred to as a floating gate, by a coupling capacitor. The floating gate is separated from the PWell of the polysilicon by an insulating material. The floating gate in connection with the PWell creates the cell channel or read transistor. The read transistor typically communicates the logical information stored by that particular memory cell during normal operations.

Typically, the read transistor for that memory cell functions as both the sensing component to communicate the information stored during normal operations, and a charging component to allow either erasing or programming information stored in that memory cell. The second polysilicon layer, the word line, typically is used to couple voltage into the floating poly gate either for write or read operations. Next, electrons charge through the coupling capacitor into the floating gate to store the information.

To create a prior non-volatile memory cell, typically a standard CMOS-based logic process is used as a starting foundation. Next, additional process steps are incorporated into the logic process flow to create the non-volatile memory cells. Examples of such additional process steps include second polysilicon deposition junction dopant optimization, etc. Integrating "non-volatile memory"-specific process steps into the standard CMOS-based logic process creates complications which require extensive qualifications. Consequently, embedded non-volatile memory technologies generally lag advanced logic fabrication processes by several generations. For a system-on-chip (SoC) approach, which requires embedding a non-volatile memory, a design team may have no choice but to accept a logic flow process usually two to three generations behind the current advanced standard logic process as well as the addition to that process of seven to eight additional lithographic masks. This prior approach not only typically increases the wafer cost, but also falls short of the peak performance that the most advanced standard logic process can deliver.

Also, the performance and reliability of a SiO2-based non-volatile memory cell tended program and erases operations due to the cycling-induced degradation of the SiO2. The previous technique of subjecting all of the non-volatile memory cell components to the higher program and erase voltages typically hastens the degradation of the SiO2.

SUMMARY OF THE INVENTION

A method, apparatus, and system in which an embedded memory comprises one or more electrically-alterable non-volatile memory cells that include a coupling capacitor, a read transistor, and a tunneling capacitor. The coupling capacitor has a first gate composed of both N+ doped material and P+ doped material, and a P+ doped region abutted to a N+ doped region. The P+ doped region abutted to the N+ doped region surrounds the first gate. The read transistor has a second gate. The tunneling capacitor has a third gate composed of both N+ doped material and P+ doped material.

BRIEF DESCRIPTION OF THE DRAWINGS

The drawings refer to the invention in which:

FIG. 3b illustrates a top-down view of an embodiment of a Positive channel MOS non-volatile memory cell using a floating gate fabricated from a single layer of polysilicon similar to the NMOS implementation shown in FIG. 3a.

While the invention is subject to various modifications and alternative forms, specific embodiments thereof have been shown by way of example in the drawings and will herein be described in detail. The invention should be understood to not be limited to the particular forms disclosed, but on the contrary, the intention is to cover all modification, equivalents, and alternatives falling within the spirit and scope of the invention.

DETAILED DISCUSSION

In the following description, numerous specific details are set forth, such as examples of specific data signals, named components, connections, arrangement of components, etc., in order to provide a thorough understanding of the present invention. It will be apparent, however, to one skilled in the art that the present invention may be practiced without these specific details. In other instances, well known components or methods have not been described in detail but rather in a block diagram in order to avoid unnecessarily obscuring the present invention. Further specific numeric references, such as first gate, may be made. However, the specific numeric reference should not be interpreted as a literal sequential order but rather interpreted that the first gate is different than a second gate. Thus, the specific details set forth are merely exemplary. The specific details may be varied from and still be contemplated to be within the spirit and scope of the present invention. The term coupled is defined as meaning connected either directly or indirectly through another component.

In general, various methods, apparatuses, and systems are described in which an embedded memory comprises one or more electrically-alterable non-volatile memory cells that include a coupling capacitor, a read transistor, and a tunneling capacitor. The coupling capacitor has a first gate composed of both N+ doped material and P+ doped material, and a P+ doped region abutted to a N+ doped region. The P+ doped region abutted to the N+ doped region surrounds the first gate. The read transistor has a second gate. The tunneling capacitor has a third gate composed of both N+ doped material and P+ doped material. In an embodiment, all of the aforementioned gates may be connected together to form a single floating gate.

Figure 2:
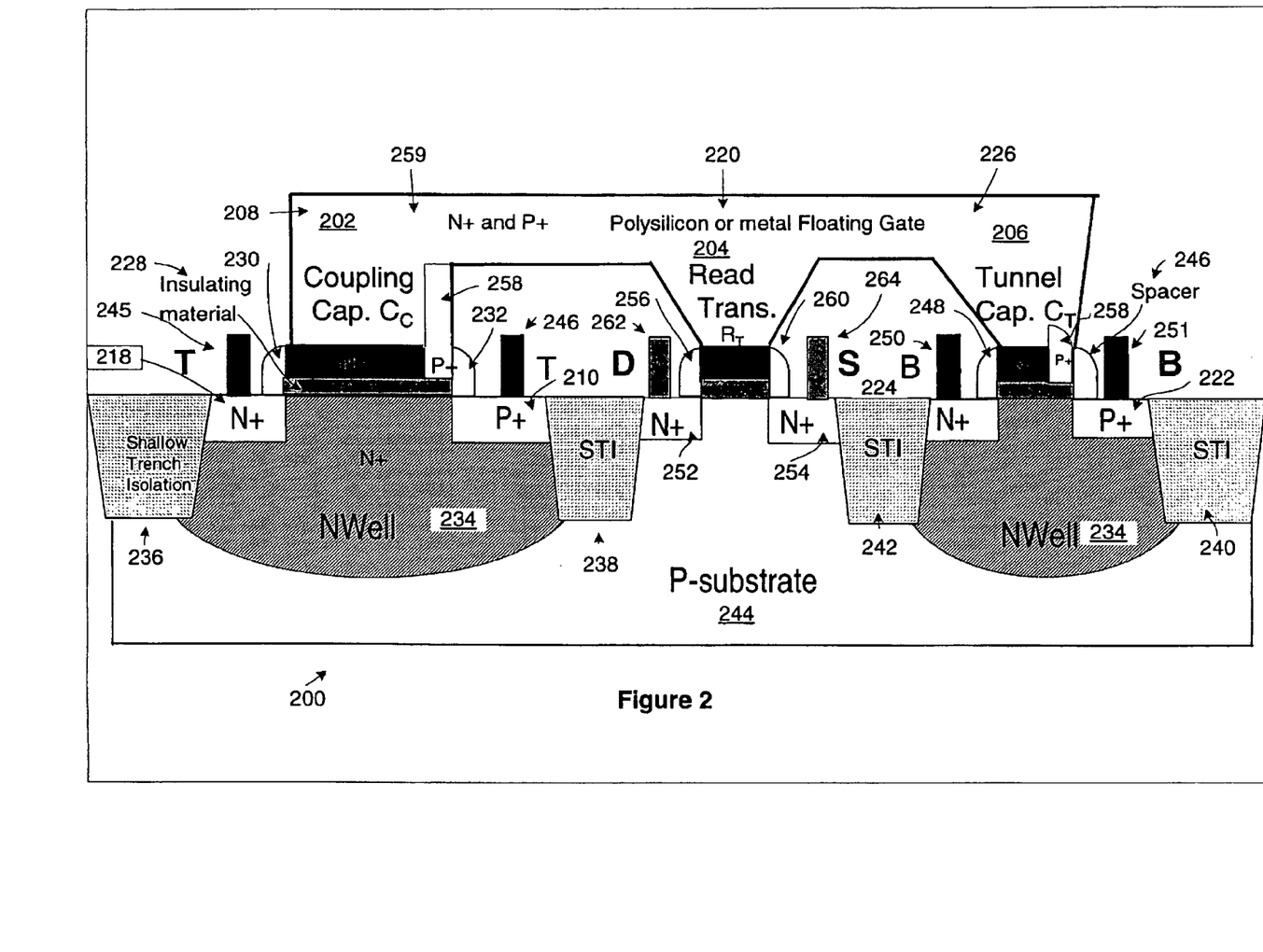
FIG. 2 illustrates a cross-sectional view of an embodiment of an electrically-alterable non-volatile memory cell.

FIG. 2 illustrates a cross-sectional view of an embodiment of an electrically-alterable non-volatile memory cell. The electrically-alterable non-volatile memory cell 200 consists of a coupling capacitor 202, a read transistor 204, and a tunneling capacitor 206. The coupling capacitor 202 comprises a first gate 208 composed of both N+ doped material 259 and P+ doped material 258. The N+ doped and P+ doped gate 208 is surrounded by a first P+ doped region 210 abutted to a first N+ doped region 218. In between the first gate 208 and the first P+ doped region 210 abutted to the first N+ doped region 218 are a first spacer 230 and a second spacer 232. An insulating material 228 exists between the first gate 208 and the N+ doped NWell region 234. The P+ doped region 210 connects to the first side of the insulating material 228 and the N+ doped region 218 connects to the second side of the insulating material 228. On either side of the coupling capacitor 202 exists shallow trench isolations 236, 238. Mounted on the first N+ doped region 218 is one or more N+ contacts 245. Mounted on the first P+ doped region 210 is one or more P+ contacts 246. The N+ contacts 245 and P+ contacts 246 may be electrically connected, for example, by a wire to be logically and electrically the same point, a common T terminal, but physically still separated components.

The tunneling capacitor 206 includes a second gate 226 composed of both N+ doped material 259 and P+ doped material 258. A second N+ doped region 224 and a second P+ doped region 222 abut together and surround the second gate 226. In between the regions 224, 222 and the second gate 226 exists a third spacer 246 and a fourth spacer 248. Further, insulating material 228 exists between the second gate 226 and the N+ doped NWell region 234. The second P+ doped region 222 connects to the first side of the insulating material 228 and the second N+ doped region 224 connects to the second side of the insulating material 228. Also, shallow trench isolations 240, 242 exist on either side of the tunneling capacitor 206. Mounted on the second N+ doped region 224 is one or more N+ contacts 250. Mounted on the second P+ doped region 222 is one or more P+ contacts 251. The N+ contacts 250 and P+ contacts 251 may be electrically connected, for example, by a wire to be logically and electrically the same point, a common B terminal, but physically still separated components.

The read transistor 204 consists of a third gate 220 separated from a third N+ region 252 and a fourth N+ region 254 abut together. The third gate 220 isolates from the N+ regions 252, 254 through use a fifth spacer 256 and sixth spacer 260. Insulating material 228 exists between the third gate 220 and a P-substrate 244. The first gate 208 of the coupling capacitor 202 and the second gate 226 of the tunneling capacitor 206 are predominately doped N+. However, each of these gates has one or more partitioned areas 258 where in those areas they are doped P+. In an embodiment, a floating gate 260 encompasses the first gate 208, the second gate 226, and the third gate 220. The floating gate 260 is fabricated from a single layer of polysilicon using a complementary metal oxide semiconductor logic process employing equal to or less than 0.35 micron technology.

The drain terminal 262 of the read transistor 204 connects to the third N+ region 252. The source terminal 264 connects to the fourth N+ region 254. Shallow trench isolations 238, 242 exist on either side of the read transistor 204. Note, in an embodiment, LOCOS (local oxidation of silicon) may be used instead of shallow trench isolations.

In an embodiment, the electrically-alterable non-volatile memory cell 200 consists of three discrete components to allow the sensing component, such as the read transistor 204, to be discrete from the charging component, such as the tunneling capacitor 206 and coupling capacitor 202 combination. Having the sensing component discrete from the charging component enhances the reliability of those components and increases their lifetime. A much higher voltage is required to perform erasing and programming operations through the charging components than the voltage required for a read operation through the sensing component. By allowing the sensing component to be discrete from charging component allows the sensing component to not be subject to the erasing and programming voltages which are higher than the sensing voltage, thereby reducing stress on the sensing component and increasing its reliability.

In an embodiment, the charge mode component operates as a capacitive divider to facilitate programming and erasing of information stored in the electrically-alterable non-volatile memory cell by symmetrical movement of charge. Thus, through the symmetrical movement of charge the programming and erasing voltages may be approximately the same value.

FIG. 2 illustrates the dopings of an exemplary negative channel-MOS, electrically-alterable, non-volatile memory cell. In embodiment, arsenic is impregnated into either metal or polysilicon to create an N+ doping. In embodiment, boron is impregnated into either a metal or polysilicon to create a P+ doping. In an embodiment, if the substrate material is changed from P-substrate to N-substrate, then the NWells should change to PWells and all other polarities will be the compliments of what is illustrated in FIG. 2. In an embodiment, the thickness of the insulating material 328 is approximately seventy angstrom units and composed of SiO2.

In an embodiment, the P+ regions and N+ regions of the tunneling capacitor 206 and the coupling capacitor 202 are used as a source supply of negative electrons, i.e. negative charge and holes, i.e. positive charge. The second P+ region 222 of the tunneling capacitor 206 and the first P+ region 210 of the coupling capacitor 202 are used as a source of positive holes during erasing and programming operations. The second N+ region 224 of the tunneling capacitor 206 and the first N+ region 218 of the coupling capacitor 202 are used as a source of negative electrons during erasing and programming operations. In an embodiment, a lower programming and erasing voltage is achievable because both N+ regions and P+ regions exist in the capacitors. In an embodiment, the lower programming and erase voltages may be, for example, 7.0 volts or lower. In an embodiment, the tunneling capacitor 206 employs a tunneling mechanism such as a Fowler-Nordhiem tunneling process, for programming and erasing. In an embodiment, the electrically-alterable non-volatile memory cell 200 can be reprogrammed multiple times such as five hundred times, a thousand times, or more.

Figure 3A:
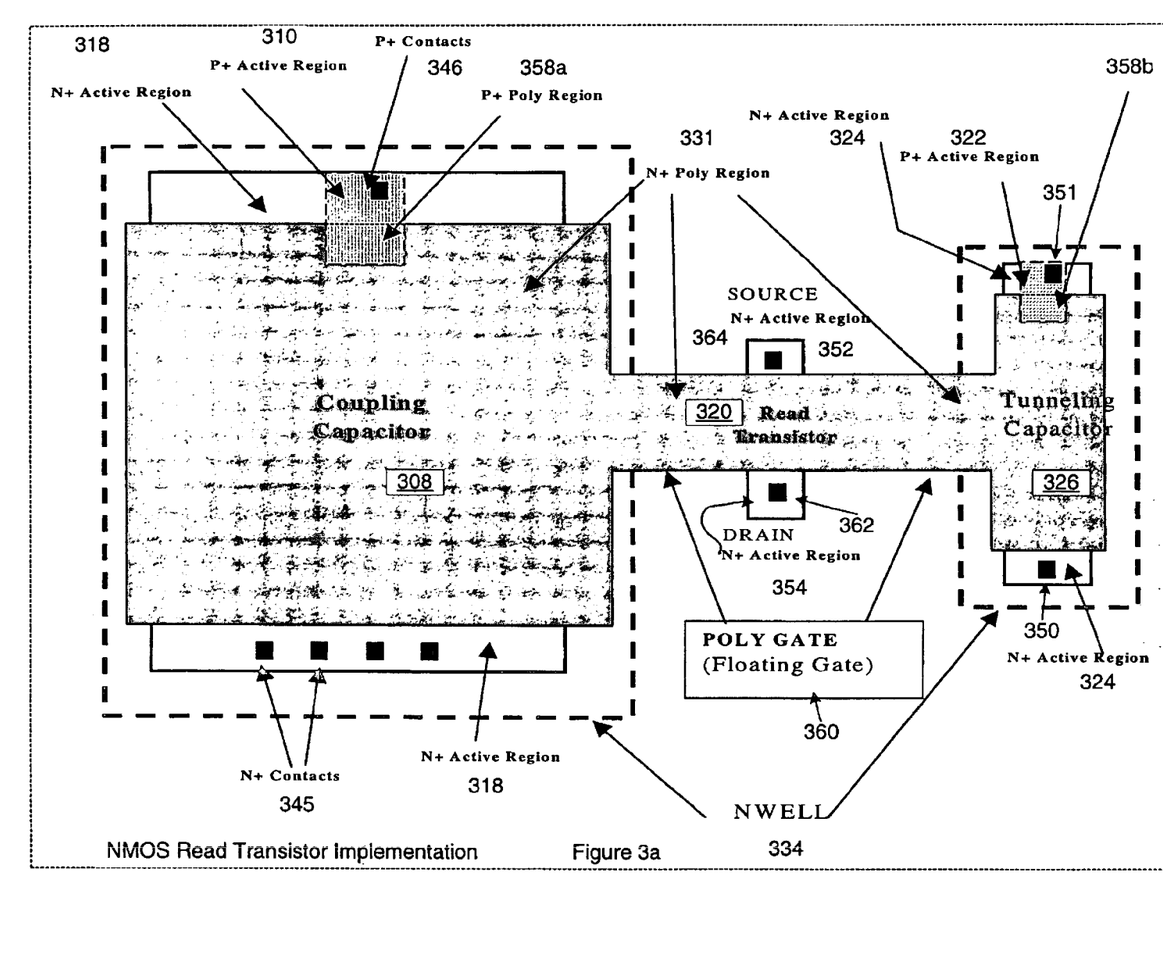
FIG. 3a illustrates a top-down view of an embodiment of the floating gate fabricated by a single layer of polysilicon and the P+ and N+ regions surrounding the coupling capacitor gate and the tunneling capacitor gate.

FIG. 3a illustrates a top-down view of an embodiment of the floating gate fabricated by a single layer of polysilicon and the P+ and N+ regions surrounding the coupling capacitor gate and the tunneling capacitor gate. In an embodiment, the coupling capacitor gate 308 is comprised of one or more P+ partitioned areas 358a, 358b and a predominant N+ doped area 331. The coupling capacitor gate 308 is deposited onto an insulating material (not shown) that separates the coupling capacitor gate 308 from the N+ doped NWell region 334.

The first P+ doped region 310 abutted to the first N+ doped region 318 surrounds the coupling capacitor gate 308. In an embodiment, the coupling capacitor gate 308 acts as the coupling capacitor's first plate and the second plate of the capacitor is the first P+ doped region 310 abutted to the first N+ doped region 318. Also, the first P+ doped region 310 abutted to the first N+ doped region 318 connects to the insulating material. Mounted on the first N+ doped region 218 is one or more N+ contacts 345. Mounted on the first P+ doped region 210 is one or more P+ contacts 346. As noted, in an embodiment, the N+ contacts 345 and P+ contacts 346 may be electrically connected to form a common T terminal.

The N+ doped gate of the read transistor 320 deposits onto the insulating material (not shown) separating the N+ gate of the read transistor 320 and the P-substrate of the read transistor (not shown). Mounted on top of the third N+ region 352 is the Source terminal 364. Mounted on top of the fourth N+ region 354 is the Drain terminal 362. Note, FIG. 3a illustrates an exemplary embodiment of a NMOS read transistor implementation of the memory cell.

The tunneling capacitor is similarly arranged as the coupling capacitor. The tunneling capacitor gate 326 is predominantly N+ doped material 331 with one or more P+ doped partitioned areas 358b. The second P+ region 322 abuts to the second N+ region 324. The second P+ region 322 abutted to the N+ region 324 surrounds the tunneling capacitor gate 326. In an embodiment, the tunneling capacitor gate 326 acts as the tunneling capacitor's first plate and the second plate of the capacitor is the second P+ region 322 abutted to the second N+ doped region 324. Mounted on the second N+ doped region 324 is one or more N+ contacts 350. Mounted on the second P+ doped region 322 is one or more P+ contacts 351. As noted, in an embodiment, the N+ contacts 350 and P+ contacts 351 may be electrically connected to form a common B terminal. In an embodiment, at least 70% of the floating gate 360 material is N+ doped 331 and the remainder of the floating gate 360 is one or more partitioned areas that are doped P+ 358a, 358b.

In an embodiment, the floating polysilicon gate 360 encompasses the tunneling capacitor gate 326, the read transistor gate 320, and the coupling capacitor gate 308. In an embodiment, the floating polysilicon gate 360 is folded over into a horizontal plane to assist the embedded memory to be manufactured in a standard logic process with a single layer of polysilicon.

In both the tunneling capacitor and the coupling capacitor, the P+ doped region 322, 310 abutted to the N+ doped region 318, 324 act as charge sources to allow more efficient bi-directional charging of the floating gate 360. Therefore, a lower programming and erase voltage can be used when charging the floating gate 360 to store information such as logical 1 or logical 0. In an embodiment, the charge mode component consists of the tunneling capacitor and the coupling capacitor. In an embodiment, the charge mode component is used to both program and erase information stored in the memory cell.

As noted, FIG. 3a illustrates an NMOS embodiment of the memory cell, in an PMOS embodiment, at least 70% of the floating gate may be P+ doped and one or more of the remaining area of the floating gate are doped N+. In an embodiment, the floating gate may be a different geometric shape such as a rectangle with areas appropriately doped P+ for the tunneling capacitor and the coupling capacitor. In an embodiment, at least 90% of the floating gate is N+ doped.

Figure 3B:
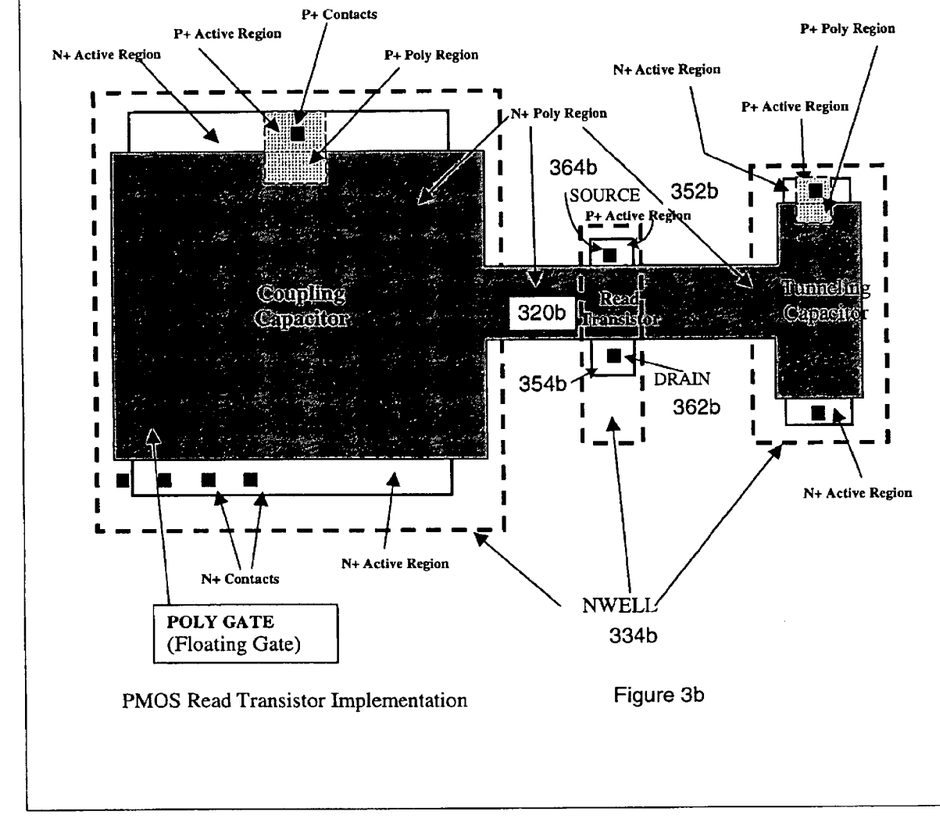

FIG. 3b illustrates a top-down view of an embodiment of a Positive-channel-MOS non-volatile memory cell using a floating gate fabricated from a single layer of polysilicon similar to the NMOS implementation shown in FIG. 3a. FIG. 3b illustrates an exemplary embodiment of a PMOS read transistor implementation of the memory cell 300. The memory cell structure 300 is similar to the NMOS read transistor implementation shown in FIG. 2 except as noted.

The N+ doped gate of the read transistor 320b deposits onto the insulating material separating the N+ gate of the read transistor 320 and a third Nwell region 334. Mounted on top of the third P+ region 352b is the Source terminal 364b. Mounted on top of the fourth P+ region 354b is the Drain terminal 362b.

Figure 4A:
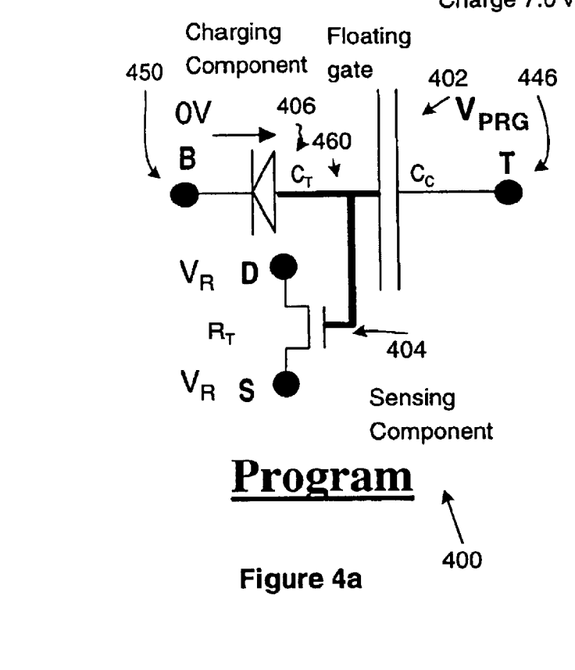
FIGS. 4A, 4B, and 4C illustrate a schematic diagram of an embodiment of the electrically-alterable non-volatile memory cell.
Figure 4B:
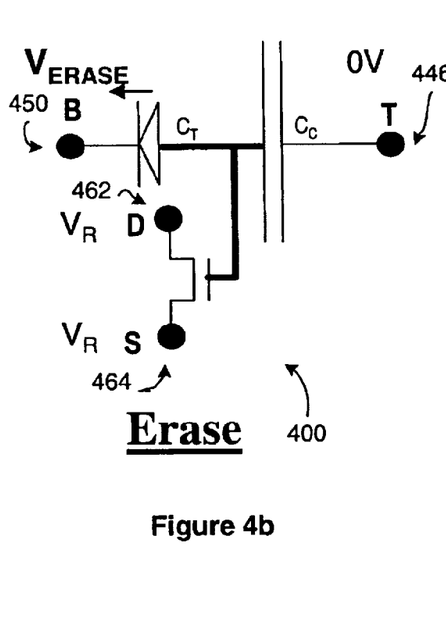
Figure 4C:
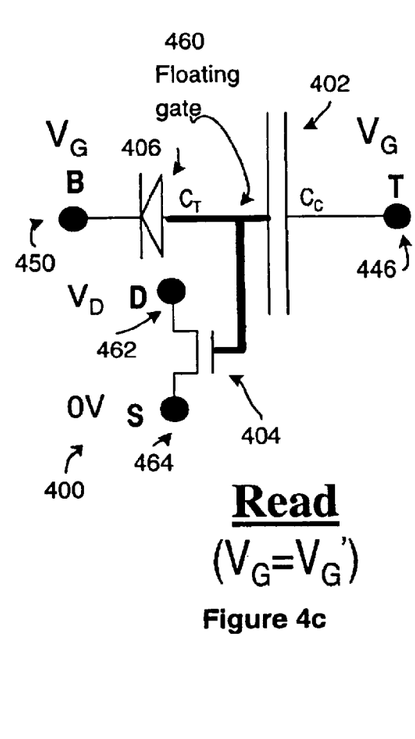

FIGS. 4A, 4B and 4C illustrate a schematic diagram of an embodiment of the electrically-alterable non-volatile memory cell. Referring to FIGS. 4A, 4b, and 4c, the electrically-alterable non-volatile memory cell 400 consists of the tunneling capacitor 406 (CT), the coupling capacitor 402 (CC) and the read transistor 404 (RT). These three components share a single floating gate 460. The coupling capacitor 402, in conjunction with the tunneling capacitor 406, forms the charging component. The charging component is operable to facilitate programming and erasing of information stored in the electrically-alterable non-volatile memory cell 400. The sense component communicates information stored in the electrically-alterable non-volatile memory cell 400 during a read operation. Thus, the charge operation enables retention of information after the power is turned off while the sense operation allows the previously stored information to be accessed after powering the memory back up. In an embodiment, the sense component is the read transistor 404. Note, the FIGS. 4A, 4B and 4C illustrate an exemplary PMOS structure. Note, FIGS. 8a–8c describe a similar schematic for a PMOS read transistor implementation.

Referring to FIG. 4A, the electrically-alterable non-volatile memory cell 400 is set up for a programming operation. The programming voltage is applied to terminal T 446, which electrically modulates the floating gate 460. Electrically reprogramming the electrically-alterable non-volatile memory cell 400 requires higher than nominal voltage to charge up the floating gate 460. In general, the non-volatile memory cell is considered programmed when the net charge introduced into the floating gate 460 is predominantly negative. This results in a net increase in the threshold voltage of the Read transistor 404. Conversely, the electrically-alterable non-volatile memory cell 400 is considered erased when the negative charges that were introduced during program are successfully removed from the floating gate 460. In an embodiment, the electrically-alterable non-volatile memory cell program and erase operations are achieved by means of quantum mechanically tunneling of electrons into and out of floating gate 460 through the tunneling capacitor 406 to alter the charge state of the memory cell.

In an embodiment, the tunneling mechanism is known as Fowler Nordheim (FN) tunneling and can be expressed as $$J_{FN} = A \cdot E_{ox}^2 \cdot \exp\left(-\frac{B}{E_{ox}}\right)$$

where JFN is the tunneled current density, $E_{OX}$=(VP−VFB−VS)/tox is the effective oxide electric field, and the two physical parameters A & B. Vp is the applied high voltage, VFB is the flat-band voltage, VS is the silicon surface band bending at the SiO2/Si interface and tox is the thickness of the tunnel gate oxide.

Therefore, to program the electrically-alterable non-volatile memory cell 400, a positive voltage VPRG is applied to terminal T 446 while the terminal B 450 is grounded as shown in FIG. 4(a). Due to the capacitive coupling of the coupling capacitor 402 and tunneling capacitor 406, large electric field strength will result to drop across the tunneling capacitor 406. When the oxide electric field is sufficiently high for FN tunneling to occur, electrons from the Nwell region through the N+ region can tunnel through the insulating material and readily inject into the floating gate. In an embodiment, the area of the coupling capacitor 402 and tunneling capacitor 406 s are appropriately scaled to provide maximum capacitive coupling.

In an embodiment, the charge coupled to the floating gate equals:

Vcouple=CC/(CC+CT)*Vp where Vcouple is the charge coupled to the floating gate. CC is the capacitance value of the coupling capacitor. CT is the capacitance value of the tunneling capacitor. Vp is the voltage applied to the terminal T.

Referring to FIG. 4b, the electrically-alterable non-volatile memory cell 400 is set up for an erase operation. The applied voltages on terminal B 450 and terminal T 446 are reverse from the programming mode to extract these excess electrons out of the electrically-alterable non-volatile memory cell 400. A positive +VERASE is applied to terminal B 450 and 0V is applied to terminal T 446. The electrons in the floating gate 460 now tunnel out of the floating gate which reduces the negative charge from the floating gate. In an embodiment, when the negative charge is removed from the floating gate 460 then the electrically-alterable non-volatile memory cell 400 stores a logical 0. In an embodiment, a low voltage, VR, is applied to the drain terminal 462 and source terminal 464 of the Read transistor 404 during either program or erase to minimize FN tunneling occurring at the Read transistor 404. In an embodiment, the erase/programming voltage may be 6.5 volts or less.

Referring to FIG. 4c the electrically-alterable non-volatile memory cell 400 is set up for a read operation. A sense voltage is applied to the drain terminal 462 and the source terminal 464 is grounded. The read transistor 404 communicates the information stored by that memory cell based upon the charge stored in the floating gate 460. The charge stored in the floating gate 460 modulates conductivity of the read transistor 404. For example, when the net charge introduced into the floating gate is predominantly negative the conductivity of the read transistor 404 is decreased indicating that this memory cell stores a logical 1. Note, during a read operation the T terminal 446 and B terminal 450 are maintained at the same voltage potential. This assists to minimizing read disturbs. A read disturb happens when the content of a memory cell that is being read is unintentionally altered from a logical 1 to a logical 0, or vice versa.

Figure 5:
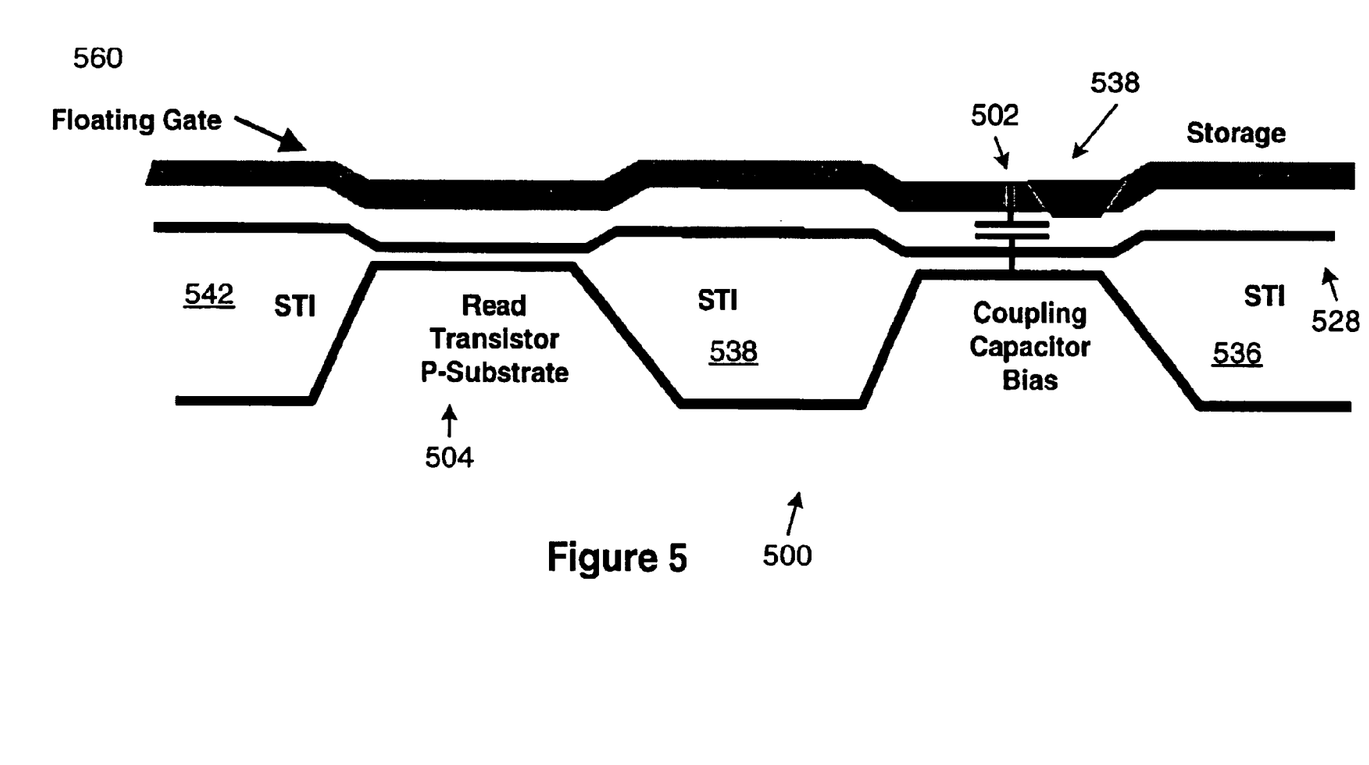
FIG. 5 illustrates an exemplary embodiment of a portion of the electrically-alterable non-volatile memory cell fabricated using a single layer of polysilicon from a CMOS logic process employing a 1.0 or less micron technology.

FIG. 5 illustrates an exemplary embodiment of a portion of the electrically-alterable non-volatile memory cell fabricated using a single layer of polysilicon from a CMOS logic process employing, for example, a 1.0 or less micron technology. The portion of the electrically-alterable non-volatile memory cell 500 illustrated consists of the single polysilicon layer forming the floating gate 560, one or more partitioned P+ doped areas 538 in the predominantly N+ doped floating gate 560, a coupling capacitor 502, an insulation layer 528, a read transistor 504 on the P-substrate, and shallow trench isolations 536, 538, 542 separating the components.

In prior techniques, the non-volatile memory cell was formed either by a dual poly-layered process, or a single poly-layered process that required additional steps over the standard CMOS logic process. Typically, in the prior techniques, thirty-five or so lithographic mask steps were required. Extra process steps included: a second poly process module, memory cell special implant process module, special dielectric formation, etc.

However, in an embodiment, the floating polysilicon gate 560 is folded over into a horizontal plane to assist the embedded memory to be manufactured in a standard logic process with a single layer of polysilicon. Further, the insulating layer 528 for isolating the gates through the tunnel oxide layer is thinner and provides less insulation as compared to the previous technique of dual polysilicon gates vertically stacked over each other illustrated in FIG. 1.

As noted above, the floating gate 560 may be used to store the charge and the bias voltage may be applied to the coupling capacitor 502. In an embodiment, the floating gate 560 may be made from either polysilicon or metal.

Figure 6:
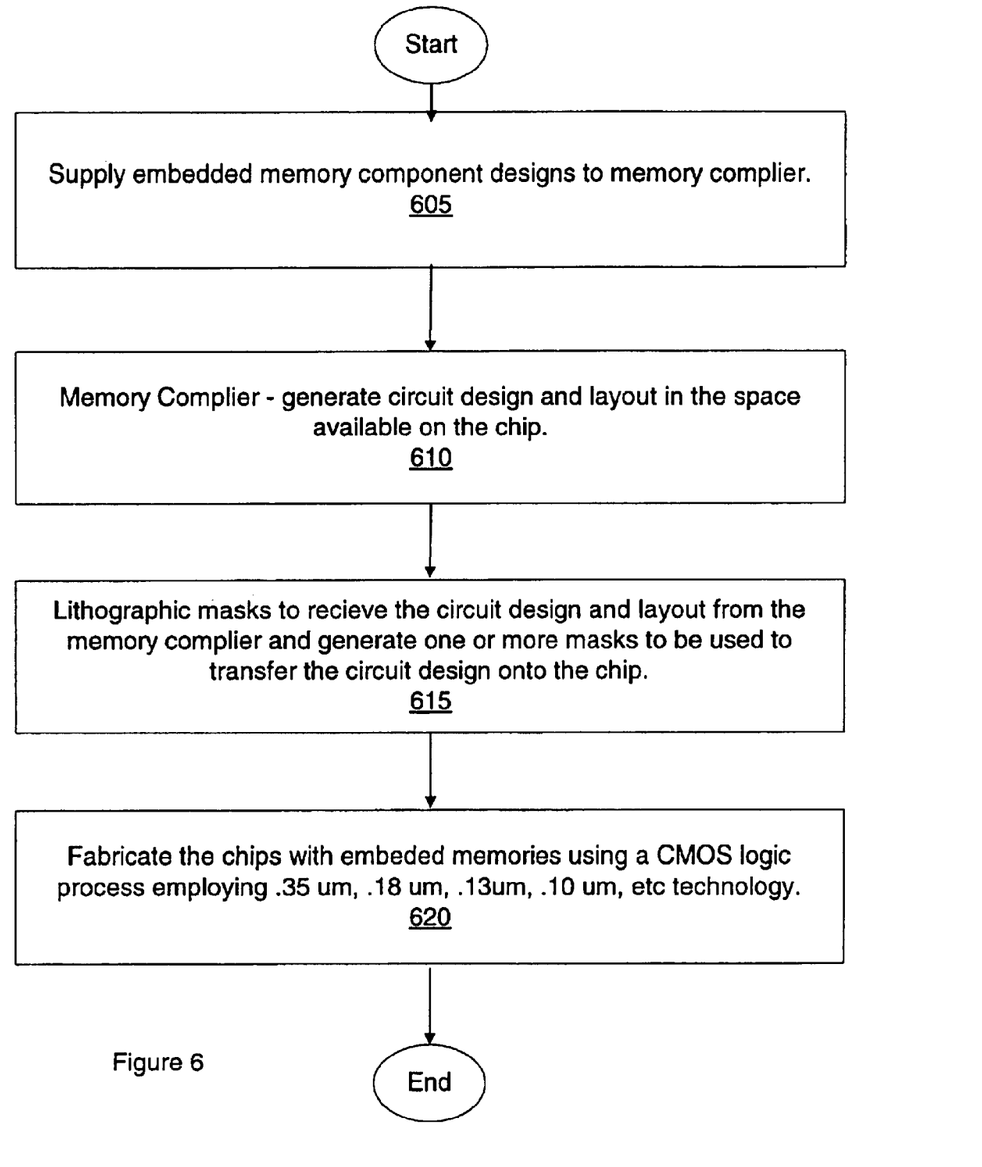
FIG. 6 illustrates a flow diagram of an exemplary process of generating an embedded memory from the memory component designs with a memory compiler.

FIG. 6 illustrates an exemplary process of generating an embedded memory from the memory component designs with a memory compiler.

In block 605, the designs for each memory component for the embedded memory are supplied to the memory compiler. A memory compiler may be a software program comprised of multiple algorithms and designs for the purpose of generating a circuit design and a layout in a space available on a target chip. The set of application-specific algorithms and interfaces of the memory compiler may used by system IC integrators to rapidly create hundreds of silicon-proven memory cores. The memory compiler receives the memory component designs and utilizes those memory component designs in conjunction with memory circuit designs to optimize a circuit design and layout in the space available on a target chip. The electrically-alterable non-volatile memory cell may be a basic memory building block utilized in a design from a non-volatile random access memory compiler.

In block 610, the memory compiler generates a circuit design and layout in the space available on a target chip. The memory compiler stores the data representing the embedded memory typically on a machine-readable medium. The memory compiler then provides design to be used to generate one or more lithographic masks to be used in the fabrication of that embedded memory.

In block 615, the machine to generate the lithographic masks receives the circuit design and layout from the memory compiler. The machine generates one or more lithographic masks to be used to transfer that circuit design onto the chip.

In block 620, a fabrication facility fabricates the chips with the embedded memories using the lithographic masks generated from the memory compiler's circuit design and layout. Fabrication facilities may use standard CMOS logic process employing 0.50 μm, 0.35 μm, 0.25 μm, 0.18 μm, 0.13 μm, 0.10 μm, or less, technologies to fabricate the chips. The size of the CMOS logic process employed typically defines the smallest minimum lithographic dimension that can be fabricated on the chip using the lithographic masks, which in turn determines minimum component size. In an embodiment, light is shown through these lithographic masks onto the chip to transfer the circuit design and layout for the embedded memory onto the chip itself. In an embodiment, the embedded memory containing one or more electrically-alterable non-volatile memory cell can be embedded into a SoC and can be fabricated in a state-of-the-art, leading edge standard logic process with no additional process steps or additional special masks. In an embodiment, the electrically-alterable non-volatile memory cell compiler is designed for embedded applications in the standard CMOS logic process.

In one embodiment, the software used to facilitate the memory compiler can be embodied onto a machine-readable medium. A machine-readable medium includes any mechanism that provides (e.g., stores and/or transmits) information in a form readable by a machine (e.g., a computer). For example, a machine-readable medium includes read only memory (ROM); random access memory (RAM); magnetic disk storage media; optical storage media; flash memory devices; DVD's, electrical, optical, acoustical or other form of propagated signals (e.g., carrier waves, infrared signals, digital signals, EPROMs, EEPROMs, FLASH, magnetic or optical cards, or any type of media suitable for storing electronic instructions. Slower mediums could be cached to a faster, more practical, medium.

Figure 7:
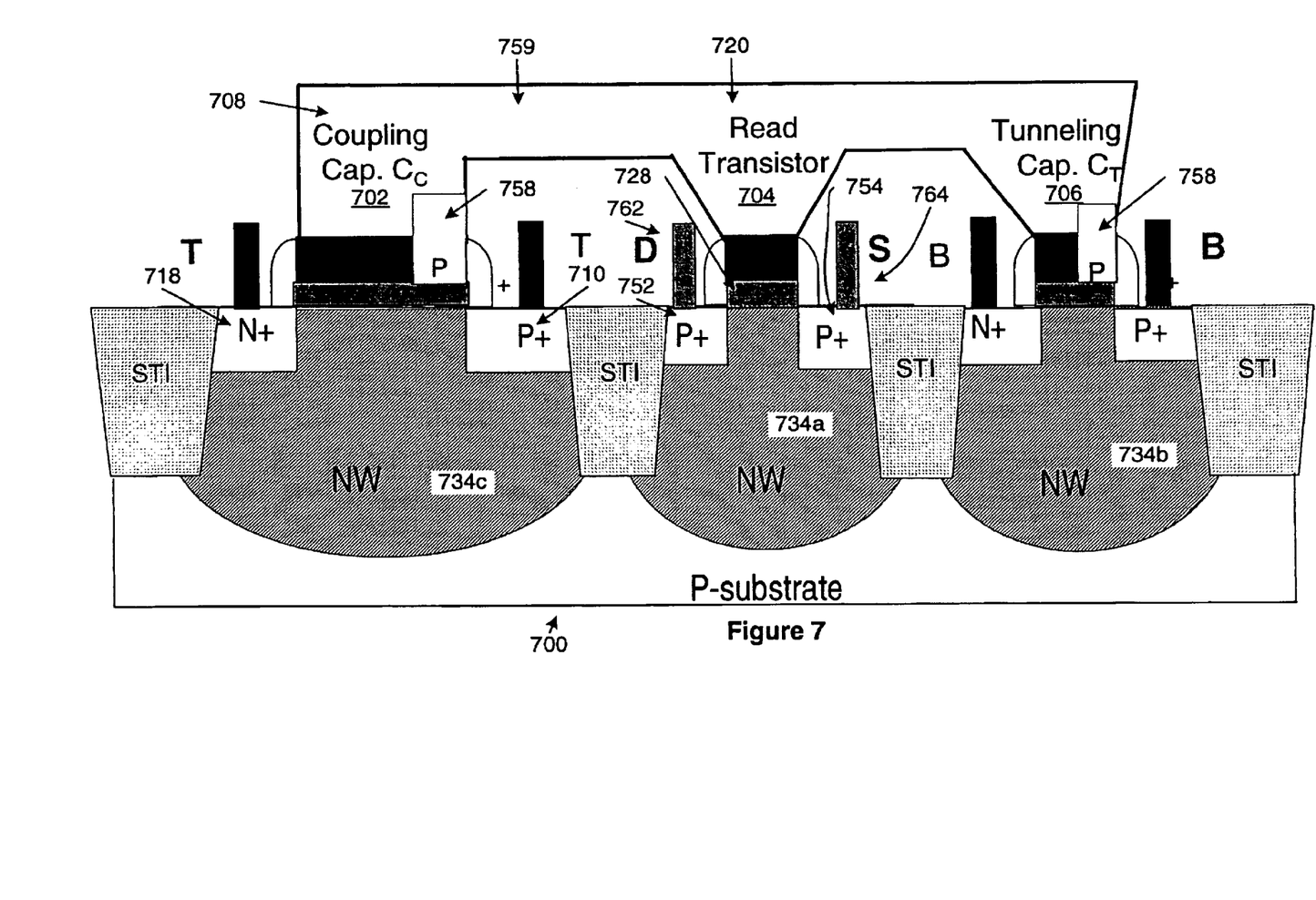
FIG. 7 illustrates a cross sectional view of the dopings and cell structure of an exemplary positive channel-MOS electrically-alterable non-volatile memory cell.

FIG. 7 illustrates a cross sectional view of the dopings and cell structure of an exemplary positive channel-MOS electrically-alterable non-volatile memory cell. In an embodiment, the electrically alterable non-volatile memory cell 700 may include components similar to those illustrated in FIG. 2 such as a coupling capacitor 702 having a first gate 708 composed of both N+ doped material 759 and P+ doped material 758, and a P+ doped region 710 abutted to a N+ doped region 718. However, the polarities and components making up the read transistor slightly differ. The N+ doped gate of the read transistor 720 is surrounded by a third P+ region 752 and a fourth P+ region 754. Insulating material 728 separates the N+ gate of the read transistor 720 and a third Nwell region 734. Mounted on top of the third P+ region 752 is a P+ contact, the Source terminal 764. Mounted on top of the fourth P+ region 754 is a P+ contact, the Drain terminal 762. The memory cell 700 in FIG. 7 operates similarly to the negative channel-MOS memory cell illustrated in FIG. 2 except for the polarities of the components being different.

In an embodiment, each component is in its own discrete well. The read transistor 704 is in a first Nwell 734a The tunneling capacitor 706 is in a second Nwell 734b. Lastly, the coupling capacitor is in a third Nwell 734c.

Also, in an embodiment, the gate of each capacitor may be entirely doped N+ or entirely doped P+.

Figure 8A:
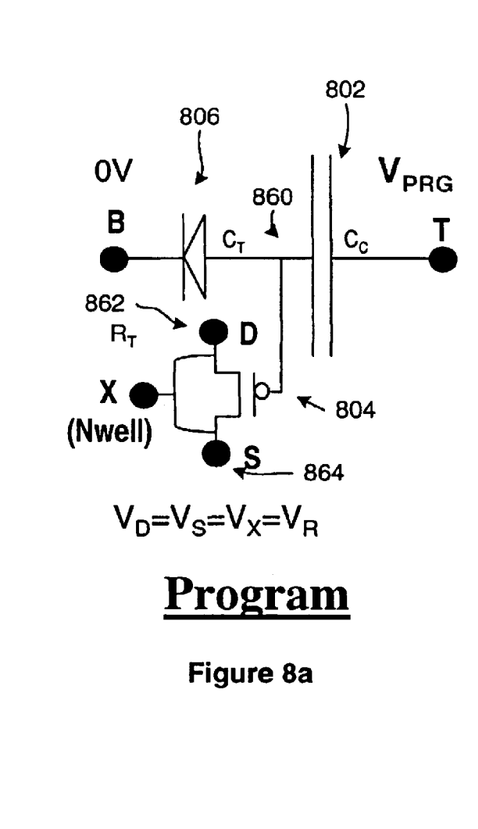
FIGS. 8A, 8B and 8C illustrate a schematic diagram of an embodiment of a PMOS implemented of the electrically-alterable non-volatile memory cell.
Figure 8B:
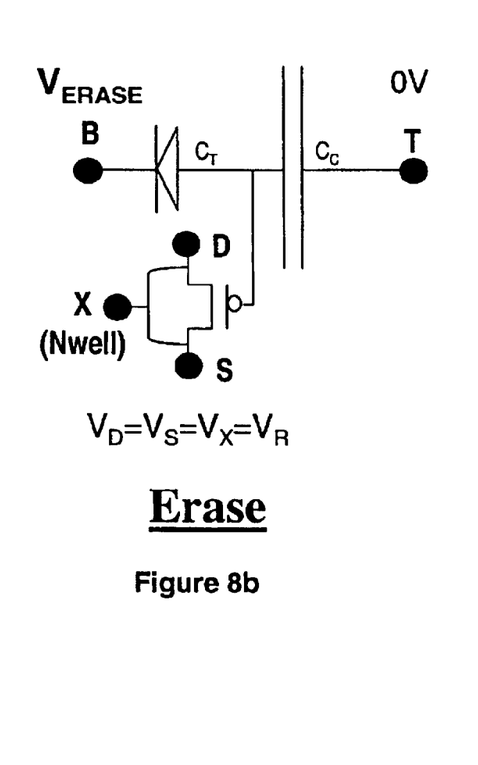
Figure 8C:
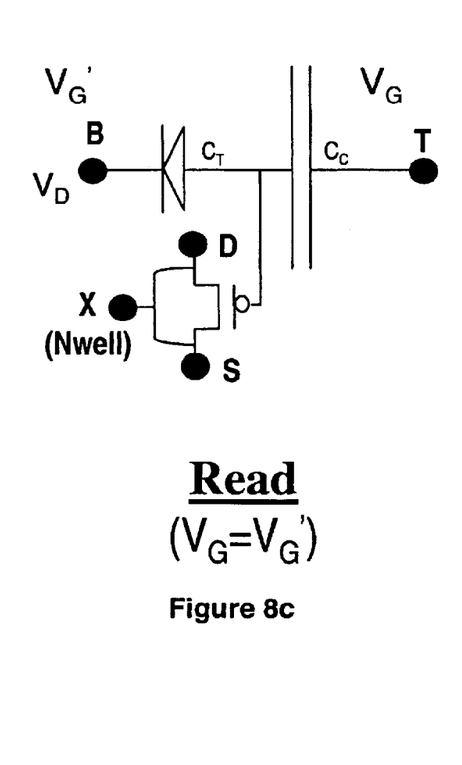

FIGS. 8A, 8B and 8C illustrate a schematic diagram of an embodiment of a PMOS implementation of the electrically-alterable non-volatile memory cell. Referring to FIGS. 8A, 8b, and 8c, the electrically-alterable non-volatile memory cell 800 consists of the tunneling capacitor 806 (CT), the coupling capacitor 802 (CC) and the read transistor 804 (RT). These three components share a single floating gate 860. In an embodiment, this represents an exemplary positive channel-MOS electrically-alterable non-volatile memory cell. The operation of the exemplary positive channel-MOS electrically alterable non-volatile memory cell is similar to that previously described in FIGS. 4a, 4b, and 4c. A notable exception is that the source terminal 864 and drain terminal 862 of the read transistor 804 are tied to the same potential voltage through the common Nwell.

Some portions of the detailed descriptions above are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the above discussions, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers, or other such information storage, transmission or display devices.

In an embodiment, the logic consists of electronic circuits that follow the rules of Boolean Logic, software that contain patterns of instructions, or any combination of both. An embedded memory typically is made up an array of rows and columns of memory cells.

In an embodiment, an exemplary memory compiler may comprise the following. A graphic user interface, a common set of processing elements, and a library of files containing design elements such as circuits, control logic, and cell arrays that define the complier. In an embodiment, object code in a set of executable software programs. A nonvolatile random access memory compiler architecture that includes one or more electrically-alterable non-volatile memory cells is a serial/parallel memory featuring a static random access memory (SRAM) section overlaid bit-for-bit with a non-volatile electrically alterable read only memory (EAROM). The nonvolatile random access memory compiler is designed for embedded applications in the generic TSMC 0.18 μm logic process. No additional special masks or special process steps are required. The nonvolatile random access memory design allows data to be easily transferred from SRAM to EAROM section (STORE operation) and back from EAROM to SRAM section (RECALL operations). The STORE and RECALL operations work simultaneously with all memory bits. The STORE operation may be usually completed in less than 300 ms (around 20 us per bit for the largest 16384 bit instance) and the RECALL operation is completed in 10 us or less (around 0.6 ns per bit for the largest 16384 bit instance).

The nonvolatile random access memory is designed for unlimited serial and parallel access to the SRAM section and minimum of 1000 STORE operations to the EAROM. Data retention is specified to be greater than 10 years in power off state (storage) or idle mode and unlimited in the keep mode. Endurance (data changes per bit) is specified to be 100 or more.

For applications where low pin count interface is essential a serial access port can be used (SHIFT cycle). During the SHIFT cycle the SRAM section is reconfigured as a single long shift register and data can be shifted serially in via the serial input (SI) pin and observed on the serial output (SO) pin.

As noted, in an embodiment, a designer chooses the specifics of the memory configuration to produce a set of files defining the requested memory instances. A memory instance may include front end views and back end files. The front end views support documentation, simulation, debugging, and testing. The back end files, such as a layout, physical LEF, etc are for layout and fabrication.

While some specific embodiments of the invention have been shown the invention is not to be limited to these embodiments. For example, the doping of the components may be reversed for implementing a NMOS structure. Geometric arrangements of the components may change. Dopings of the components may change, etc. The invention is to be understood as not limited by the specific embodiments described herein, but only by scope of the appended claims.

What is claimed is:

1. An integrated circuit, comprising:
   one or more electrically-alterable non-volatile memory cells, an electrically alterable non-volatile memory cell including
   a coupling capacitor having a first plate to act as a first gate and a second plate composed of a P+ doped region abutted to a N+ doped region;
   a read transistor having a second gate; and
   a tunneling capacitor having a third plate to act as a third gate and a fourth plate.

2. The integrated circuit of claim 1, further comprising:
   a floating gate that encompasses the first gate, the second gate, and the third gate, the floating gate fabricated from a single layer of polysilicon.

3. The integrated circuit of claim 1, further comprising:
   a floating gate that includes the first gate, the second gate, and the third gate; and
   a conductive strip electrically connecting the first gate, the second gate, and the third gate.

4. The integrated circuit of claim 1, wherein the tunneling capacitor is operable to both program and erase information stored in the electrically-alterable non-volatile memory cell.

5. The integrated circuit of claim 4, wherein the information stored in the memory cell is either a logical 1 or a logical 0.

6. The integrated circuit of claim 1, wherein the integrated circuit is fabricated using a standard Complementary Metal Oxide Semiconductor logic process.

7. The integrated circuit of claim 6, wherein the standard Complementary Metal Oxide Semiconductor logic process employs equal to or less than 1.0 micron technology.

8. The integrated circuit of claim 6, wherein the read transistor to communicate information stored in the electrically-alterable non-volatile memory cell during a read operation.

9. The integrated circuit of claim 1, wherein the read transistor is a positive channel metal oxide semiconductor.

10. The integrated circuit of claim 1, wherein the read transistor is a negative channel metal oxide semiconductor.

11. The integrated circuit of claim 1, wherein the first plate is composed of both N+ doped material and P+ doped material.

12. The integrated circuit of claim 1, wherein the third plate is composed of both N+ doped material and P+ doped material.

13. The integrated circuit of claim 1, wherein the third plate is composed of both N+ doped material and P+ doped material, and the first plate is composed of both N+ doped material and P+ doped material.

14. An integrated circuit, comprising:
   one or more electrically-alterable non-volatile memory cells, an electrically alterable non-volatile memory cell including
   a coupling capacitor having a first plate to act as a first gate and a second plate;
   a read transistor having a second gate; and
   a tunneling capacitor having a third plate to act as a third gate and a fourth plate composed of a P+ doped region abutted to a N+ doped region.

15. The integrated circuit of claim 14, wherein the third plate is composed of both N+ doped material and P+ doped material.

16. The integrated circuit of claim 15, wherein the first plate is composed of both N+ doped material and P+ doped material.

17. A machine readable medium that stores data representing a memory that includes:
   one or more electrically-alterable non-volatile memory cells, an electrically-alterable non-volatile memory cell including
   a coupling capacitor having a first plate to act as a first gate and a second plate composed of a P+ doped region abutted to a N+ doped region;
   a read transistor having a second gate; and
   a tunneling capacitor having a third gate.

18. The machine readable medium of claim 17, wherein the machine readable medium comprises a memory complier to provide a design for one or more lithographic masks used in fabrication of the embedded memory.

19. The machine readable medium of claim 18, wherein the design for the one or more lithographic masks are utilized during a Complementary Metal Oxide Semiconductor logic process employing equal to or less than 1.0 micron technology.

20. The machine readable medium of claim 17, wherein the electrically-alterable non-volatile memory cell is programmable at least five hundred or more times.

21. The machine readable medium of claim 17, wherein the coupling capacitor is located in a first well and the tunneling capacitor is located in a second well.

22. The machine readable medium of claim 21, wherein the read transistor is located in a third well.

* * * * *